United States Patent
Tanaka et al.

(10) Patent No.: US 7,394,704 B2
(45) Date of Patent: *Jul. 1, 2008

(54) NON-VOLATILE SEMICONDUCTOR MEMORY DEVICE, ELECTRONIC CARD USING THE SAME AND ELECTRONIC APPARATUS

(75) Inventors: Tomoharu Tanaka, Yokohama (JP); Khandker N. Quader, Sunnyvale, CA (US); Hiroyuki Dohmae, Yokohama (JP); Atsushi Inoue, Irvine, CA (US); Takeaki Sato, Meerbusch (DE)

(73) Assignees: Kabushiki Kaisha Toshiba, Tokyo (JP); Sandisk Corporation, Sunnyvale, CA (US)

( * ) Notice: Subject to any disclaimer, the term of this patent is extended or adjusted under 35 U.S.C. 154(b) by 125 days.

This patent is subject to a terminal disclaimer.

(21) Appl. No.: 11/289,509

(22) Filed: Nov. 30, 2005

(65) Prior Publication Data

US 2006/0077712 A1 Apr. 13, 2006

Related U.S. Application Data

(63) Continuation of application No. 10/823,737, filed on Apr. 14, 2004, now Pat. No. 6,990,018.

(30) Foreign Application Priority Data

Apr. 18, 2003 (JP) ............................. 2003-114762

(51) Int. Cl.
*G11C 7/10* (2006.01)
(52) U.S. Cl. ............................. 365/189.01; 365/185.17; 365/185.26; 365/185.33; 365/189.04

(58) Field of Classification Search ............ 365/189.01, 365/185.17, 185.26, 185.33, 189.04, 185.09
See application file for complete search history.

(56) References Cited

U.S. PATENT DOCUMENTS 5,621,682 A * 4/1997 Tanzawa et al. ........ 365/185.03

(Continued)

FOREIGN PATENT DOCUMENTS

EP 1 065 594 A2 1/2001

(Continued)

OTHER PUBLICATIONS

U.S. Appl. No. 11/289,509, filed Nov. 30, 2005, Tanaka et al.

(Continued)

*Primary Examiner*—Pho M. Luu
(74) *Attorney, Agent, or Firm*—Oblon, Spivak, McClelland, Maier & Neustadt, P.C.

(57) ABSTRACT

A non-volatile semiconductor memory device comprising a plurality of non-volatile semiconductor memory cells, an interface making data exchange with an external device to write/read data with respect to the non-volatile semiconductor memory cells, and a control circuit for controlling the non-volatile semiconductor memory cells, wherein the interface and the control circuit include a first read mode initialized via a first bootstrap to read data from the non-volatile semiconductor memory cells for continuously outputting (N+M)-byte (N is the n-th power of 2, n is positive integers) data via the interface, and a second read mode initialized via a second bootstrap to read data from the non-volatile semiconductor memory cells for continuously outputting K-byte (K is the k-th power of 2, k is positive integers) data via the interface.

6 Claims, 14 Drawing Sheets

U.S. PATENT DOCUMENTS

| | | |
|---|---|---|
| 5,719,888 A | 2/1998 | Tanzawa et al. |
| 5,901,152 A | 5/1999 | Tanaka et al. |
| 5,933,436 A | 8/1999 | Tanzawa et al. |
| 5,996,108 A | 11/1999 | Tanzawa et al. |
| 6,611,938 B1 | 8/2003 | Tanaka et al. |
| 6,614,715 B2 * | 9/2003 | Tsao et al. ............... 365/238.5 |
| 6,990,018 B2 * | 1/2006 | Tanaka et al. .......... 365/185.09 |
| 2001/0009505 A1 | 7/2001 | Nishizawa et al. |
| 2002/0021595 A1 | 2/2002 | Terada |

FOREIGN PATENT DOCUMENTS

| | | |
|---|---|---|
| JP | 2001-14888 | 1/2001 |
| JP | 3272903 | 1/2002 |

OTHER PUBLICATIONS

T. Tanzawa et al. "A Compact On-Chip ECC for Low Cost Flash Memories", 1996 Symposium on VLSI Circuits Digest of Technical Papers, pp. 74-75.

* cited by examiner

CSLj
(j-column select signal)

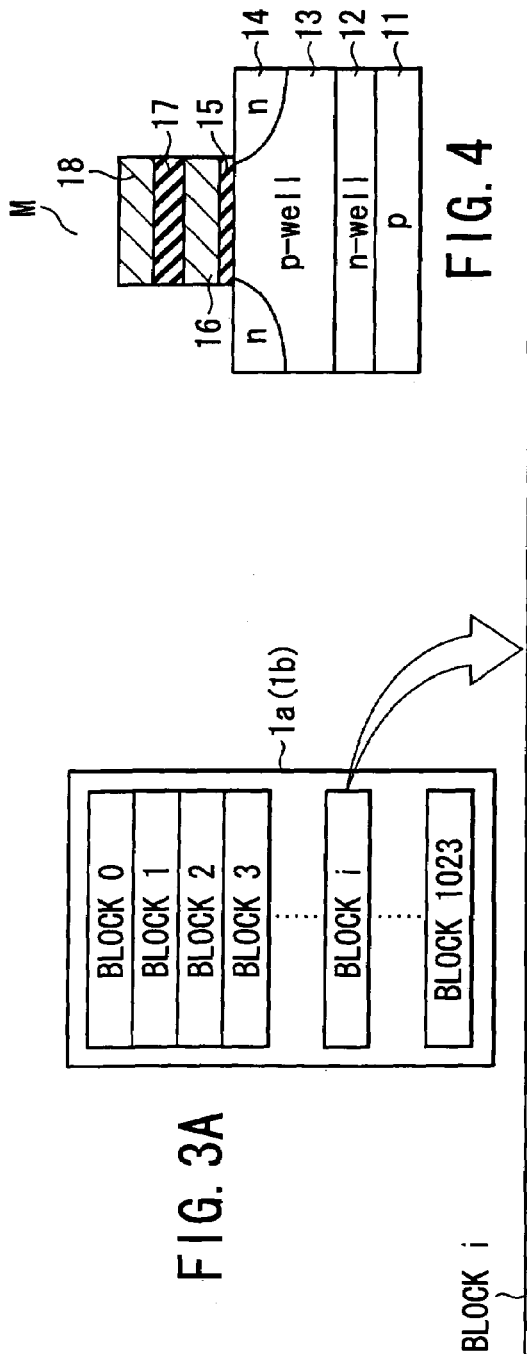
FIG. 3A
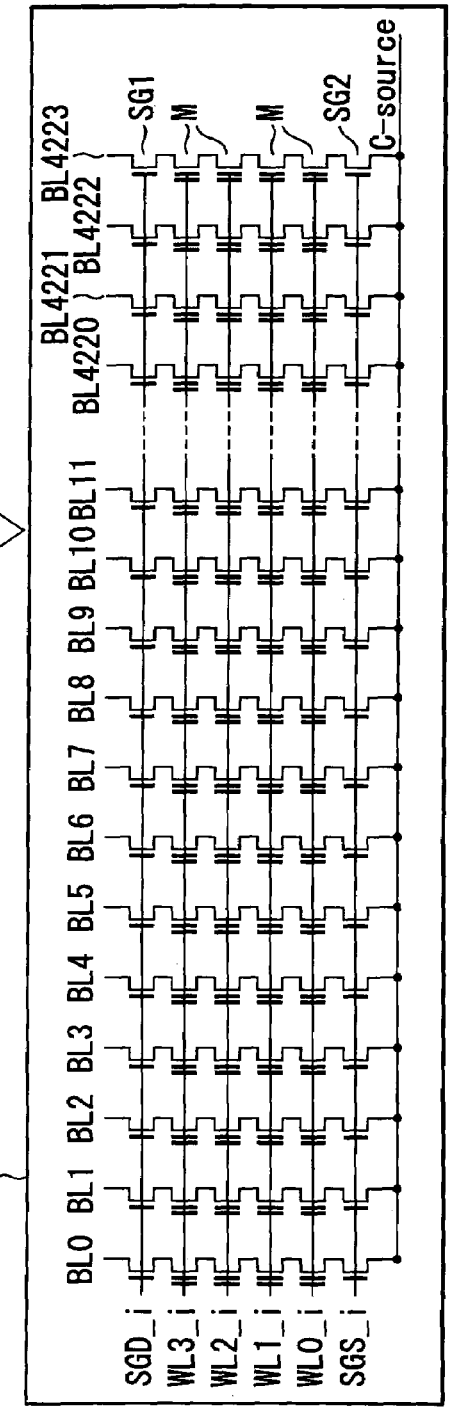
FIG. 3B
FIG. 4

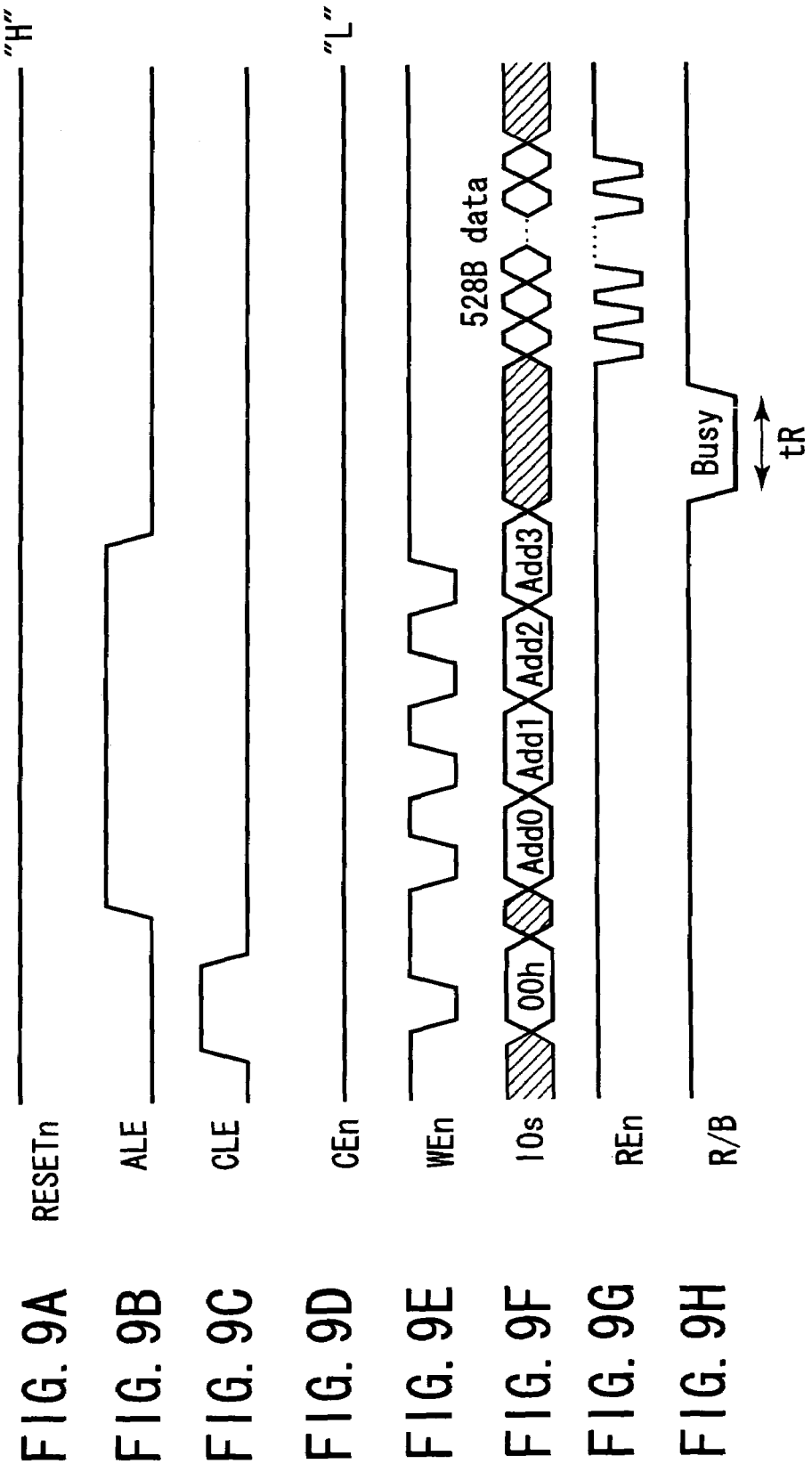

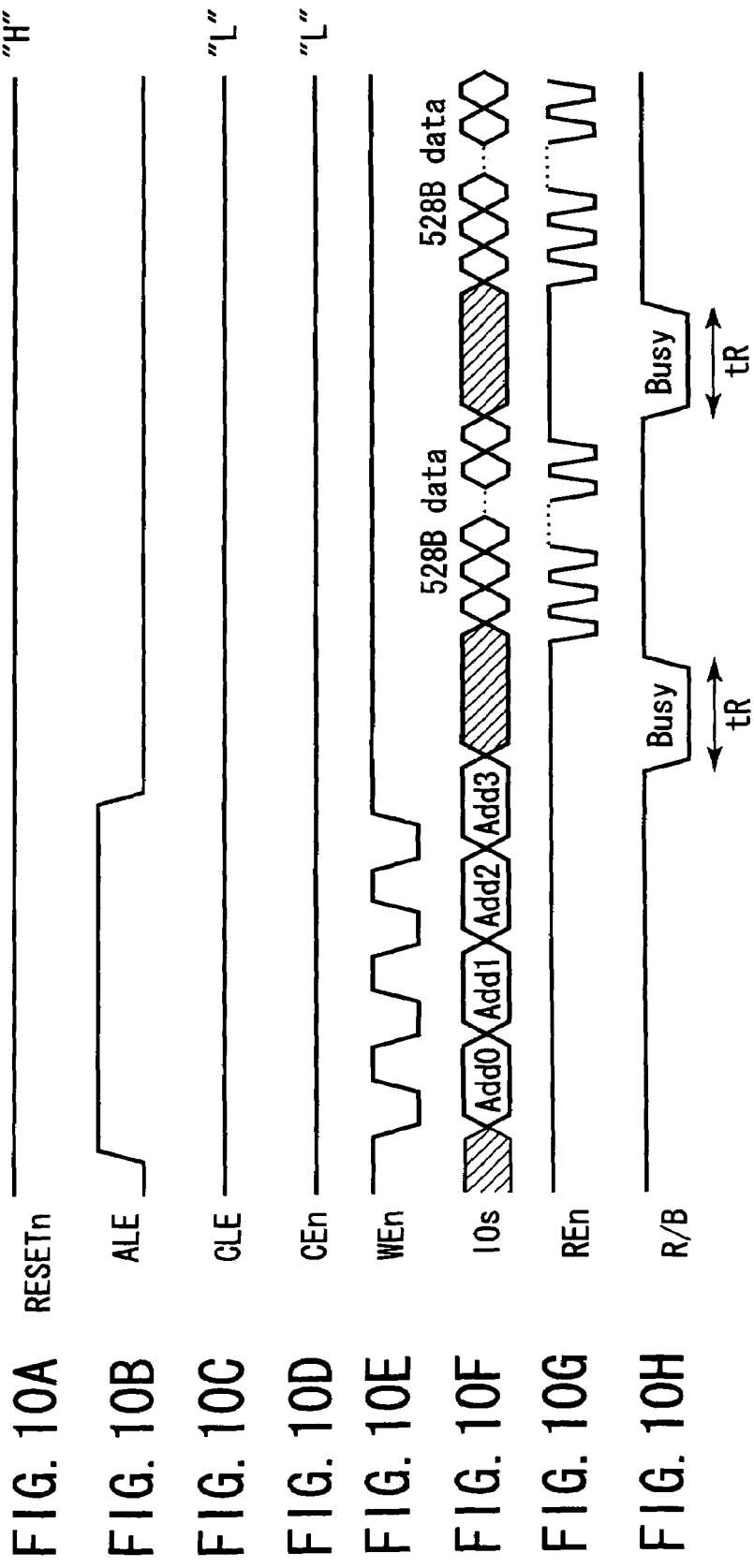

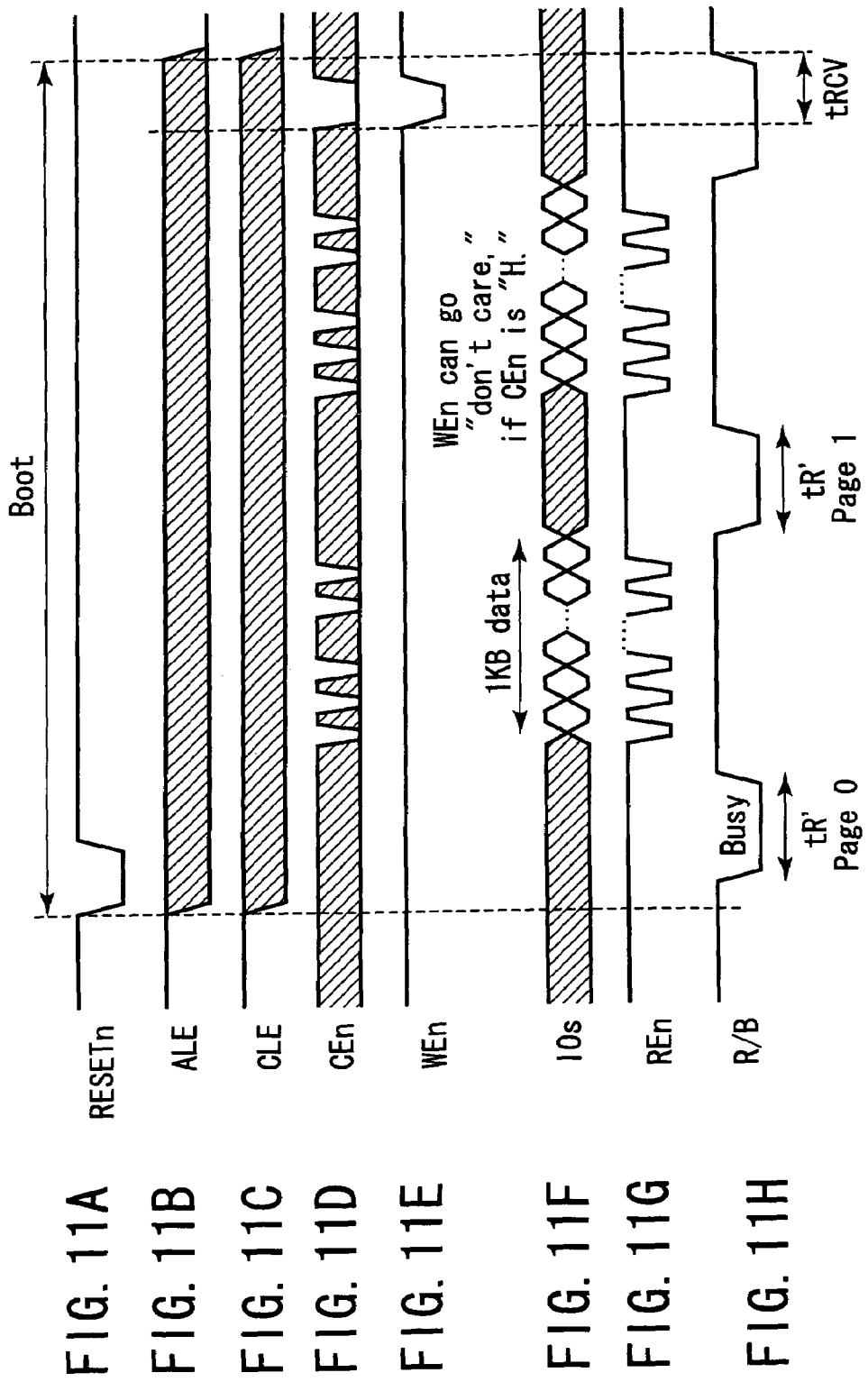

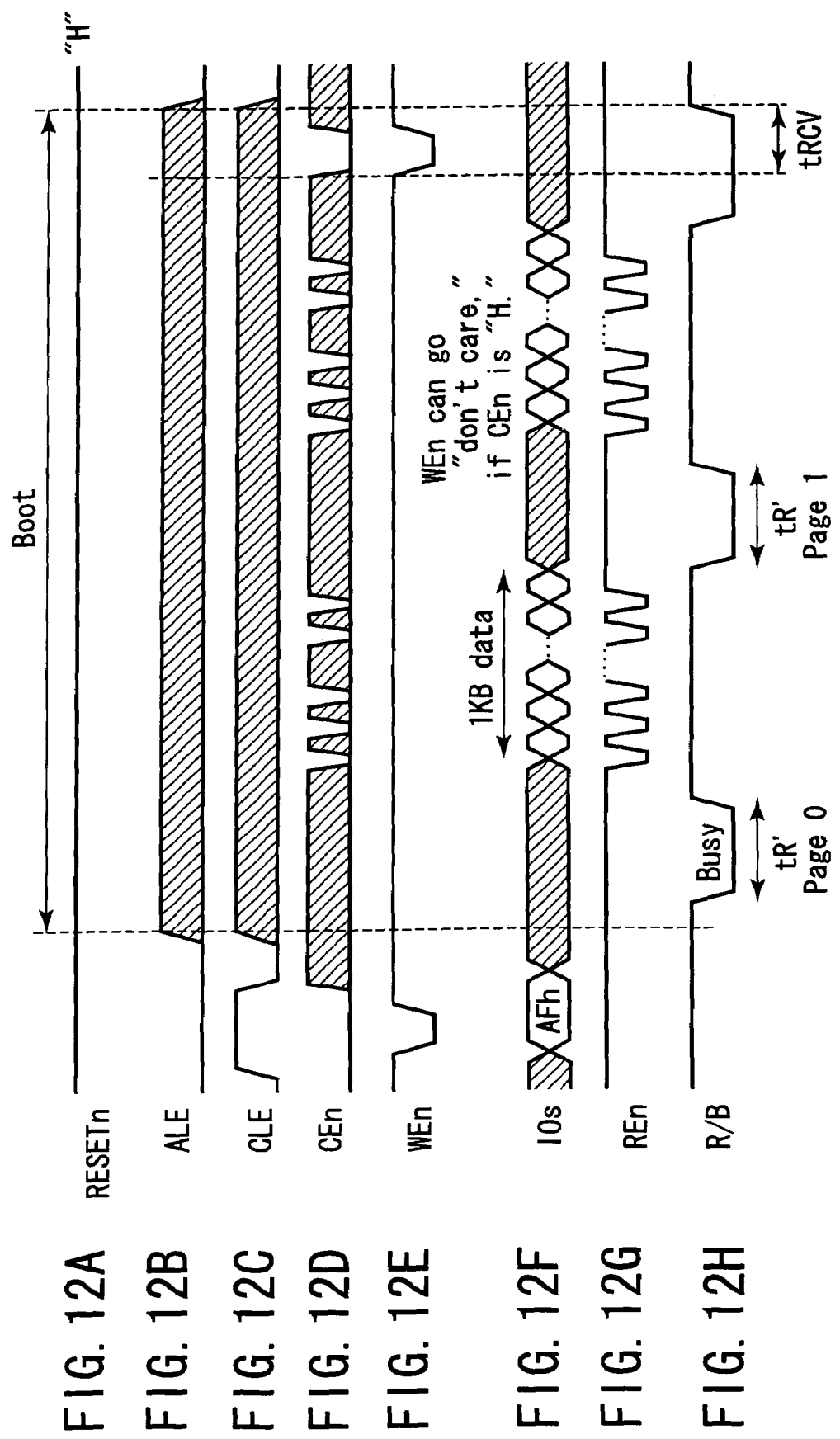

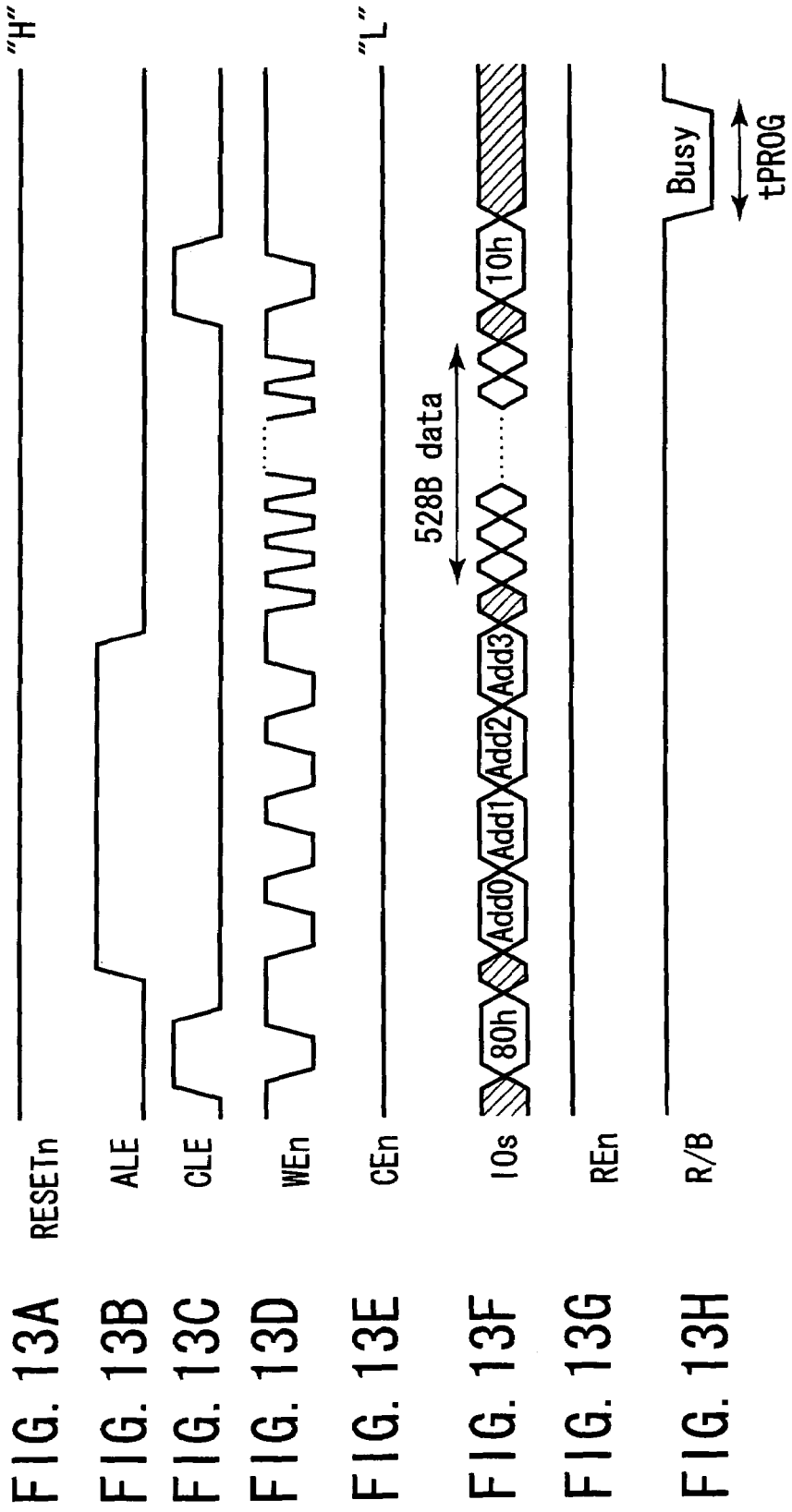

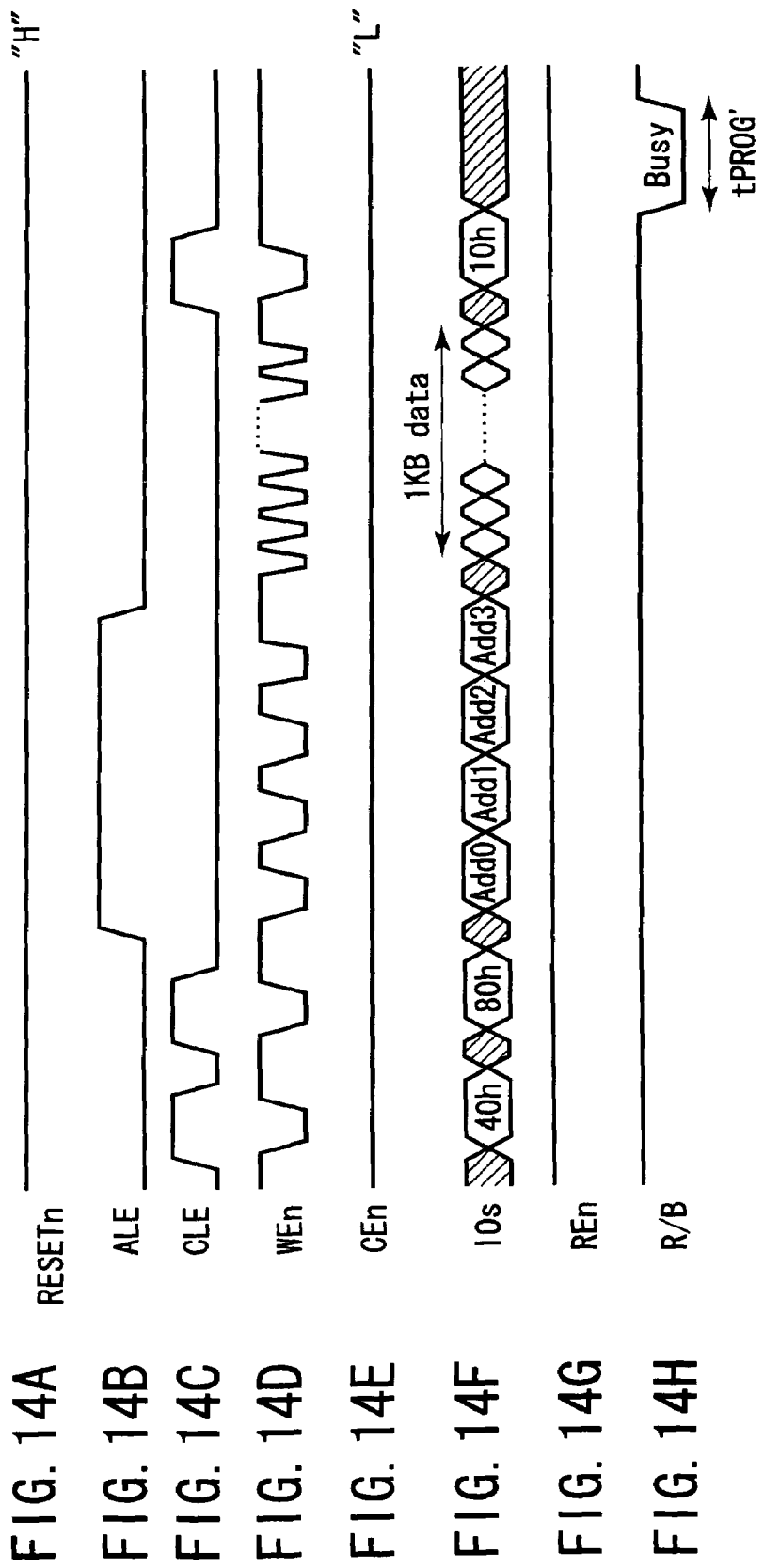

NON-VOLATILE SEMICONDUCTOR MEMORY DEVICE, ELECTRONIC CARD USING THE SAME AND ELECTRONIC APPARATUS

CROSS-REFERENCE TO RELATED APPLICATIONS

This application is a continuation application of U.S. application Ser. No. 10/823,737, filed Apr. 14, 2004, now U.S. Pat. No. 6,990,018 and claims priority to Japanese Patent Application No. 2003-114762, filed Apr. 18, 2003, the entire contents of which are incorporated herein by reference.

BACKGROUND OF THE INVENTION

1. Field of the Invention

The present invention relates to an electrically data rewritable non-volatile semiconductor memory device, to an electronic card using the same and to an electronic apparatus. In particular, the present invention relates to read/write control with respect to memory cell arrays formed of the non-volatile semiconductor devices, and is applied to NAND type flash memories, for example.

2. Description of the Related Art

Of electrically data rewritable non-volatile semiconductor memory devices, a batch erasable flash memory stores data by varying an amount of charges injected in a floating gate of a memory cell transistor to change the threshold voltage thereof at the data erase/write operation. For example, when electrons are ejected from the floating gate to make negative the threshold voltage of the memory cell transistor, data "0" is stored, while the electrons are injected to make positive the threshold voltage, thereby storing data "1". Electron ejection/injection is carried out between a floating gate and a semiconductor substrate via a tunnel oxide film. For this reason, the tunnel oxide film is degraded with an increase of the number of data rewriting times. When the tunnel oxide film is degraded, electrons injected to the floating gate leaks through the tunnel oxide film. As a result, it is difficult to hold the written data in the memory cell transistor. In most of flash memories, the number of rewritable times is one hundred thousand to one million times per memory cell transistor.

Recently, many control systems using the flash memory employ error correction system to take suitable steps for the case where data is broken down to cause data error. During the data error is corrected by using the error correction system, many data rewriting is performed. For example, even if one bit of 528-byte memory cell array has an error, the error correction system corrects the one-byterror through many data rewriting operations. Conventionally, the error correction system has been included in an exclusive controller chip designed to have specialized operations in order to reduce the cost of the flash memory and making error corrections at high speed.

On the other hand, in the control system of an electronic apparatus using the flash memory, a processor unit fetches boot programs for booting the system at the start-up (boot) time. The boot programs include data for controlling the flash memory and error correction programs.

FIG. 20 is a block diagram showing the configuration of a control system using a conventional NAND flash memory.

In the figure, a microprocessor (MPU) 103 is connected to a ROM 104, an SRAM 102 and a NAND flash memory 105 via a system I/O bus line. The MPU 103 reads the system boot programs from the ROM 104 when the system starts up, and controls the SRAM 102 and the NAND flash memory 105. The system boot programs include codes for making error corrections on data of the NAND flash memory 105. The NAND flash memory 105 is used as a file storage in a similar manner as a magnetic disk, and also, is used as an image memory in a digital camera and the like.

The technique of providing the error correction system to the flash memory is disclosed in the following documents.

Japanese Patent No. 3272903 specification

Jpn. Pat. Aplln. KOAKI Publication No. 2001-14888

T. Tanzawa et al., "A Compact On-chip ECC for Low Cost Flash Memories", 1996 symposium on VLSI circuits Digest of Technical Papers As described above, the system using the conventional flash memory requires additional devices such as a controller chip for making error corrections and a ROM for storing boot programs. For this reason, there is a problem that many constituent devices are needed to compose the control system.

BRIEF SUMMARY OF THE INVENTION

According to a first aspect of the present invention, there is provided a non-volatile semiconductor memory device comprising:

a plurality of non-volatile semiconductor memory cells;

an interface making data exchange with an external device to write/read data with respect to the non-volatile semiconductor memory cells; and a control circuit for controlling the non-volatile semiconductor memory cells, wherein the interface and the control circuit include a first read mode initialized via a first bootstrap to read data from the non-volatile semiconductor memory cells for continuously outputting (N+M)-byte (N is the n-th power of 2, n is positive integers) data via the interface, and a second read mode initialized via a second bootstrap to read data from the non-volatile semiconductor memory cells for continuously outputting K-byte (K is the k-th power of 2, k is positive integers) data via the interface. In this case, a relation K>N is given, for example.

According to another aspect of the present invention, there is provided an electronic card loaded with the non-volatile semiconductor memory device of the first aspect of the present invention.

According to still another aspect of the present invention, there is provided an electronic apparatus comprising:

the electronic card of the first aspect of the present invention;

a card slot electrically connectable to the electronic card; and a card interface connected to the card slot.

BRIEF DESCRIPTION OF THE SEVERAL VIEWS OF THE DRAWING

FIGS. 3A and 3B are circuit diagrams showing the configuration of one selected from two memory cell arrays shown in FIG. 1;

FIG. 4 is a cross-sectional view showing the structure of one selected from memory cells shown in FIG. 3;

FIGS. 9A to 9H are timing waveform charts to explain the operation of reading data from an area except for the ROM area of the NAND flash memory shown in FIG. 2 in the same read mode as that of the conventional NAND flash memory;

FIGS. 10A to 10H are timing waveform charts to explain the operation of reading data from an area except for the ROM area of the NAND memory shown in FIG. 2 in a read mode different from the read mode shown in FIG. 9;

FIGS. 11A to 11H are timing waveform charts to explain the operation of carrying out system boot in a command-less and address-less mode caused by hardware reset of the NAND flash memory shown in FIG. 2 using data stored in the ROM area;

FIGS. 12A to 12H are timing waveform charts to explain the operation of carrying out system boot according to command from MPU caused by software reset of the NAND flash memory shown in FIG. 2 using data stored in the ROM area;

FIGS. 13A to 13H are timing waveform charts to explain the operation of writing data to areas other than ROM area of the NAND memory shown in FIG. 2 in the similar manner as that of the NAND flash memory;

FIGS. 14A to 14H are timing waveform charts to explain the operation of writing data to the ROM area of the NAND memory shown in FIG. 2;

DETAILED DESCRIPTION OF THE INVENTION

Embodiments of the present invention will be described below in detail with reference to the accompanying drawings.

FIRST EMBODIMENT

Figure 1:
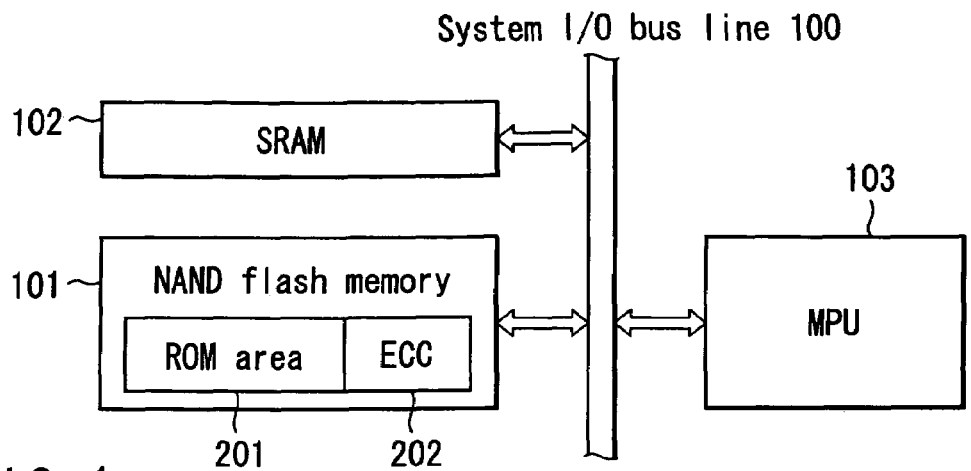
FIG. 1 is a block diagram showing the configuration of a NAND flash memory according to a first embodiment of the present invention and a control system using the same.
Figure 20:
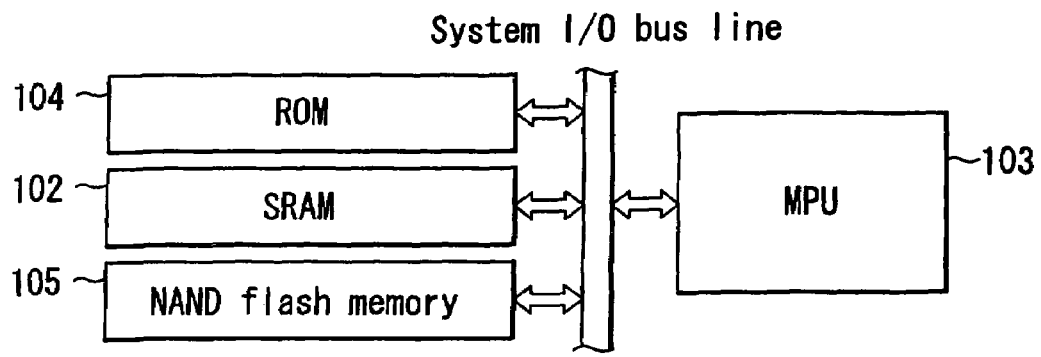
FIG. 20 is a block diagram showing the configuration of a control system using a conventional NAND flash memory.

FIG. 1 is a block diagram showing the configuration of a NAND flash memory according to a first embodiment of the present invention and a control system using the same. The same reference numerals are used to designate elements corresponding to FIG. 20, and the details are omitted.

A NAND flash memory 101 includes a memory cell array area which is used as a ROM area 201 and another area which is used as an error correction circuit (ECC) area 202 for performing data corrections on data of the ROM area 201.

Access to memory sections other than the ROM area 201 in the NAND flash memory 101 is made using the same interface as the conventional NAND flash memory 105, and thereby, compatibility with the conventional NAND flash memory is kept.

The MPU 103 makes access to the NAND flash memory 101 via the system I/O bus line 100 in system boot (startup) to read system boot programs including control codes for NAND flash memory 101 and codes for making data error corrections.

Incidentally, the MPU 103, which is a controller for controlling NAND flash memory 101 and the like, may detect a rise of the system power source to boot the NAND flash memory 101. In addition, the NAND flash memory 101 may detect a rise of power source to boot the self. Further, if the system boot programs thus read is copied to the SRAM 102 via the system I/O bus line 100, the SRAM 102 is used as cache memory so long as the system power is supplied; therefore, it is convenient.

Figure 2:
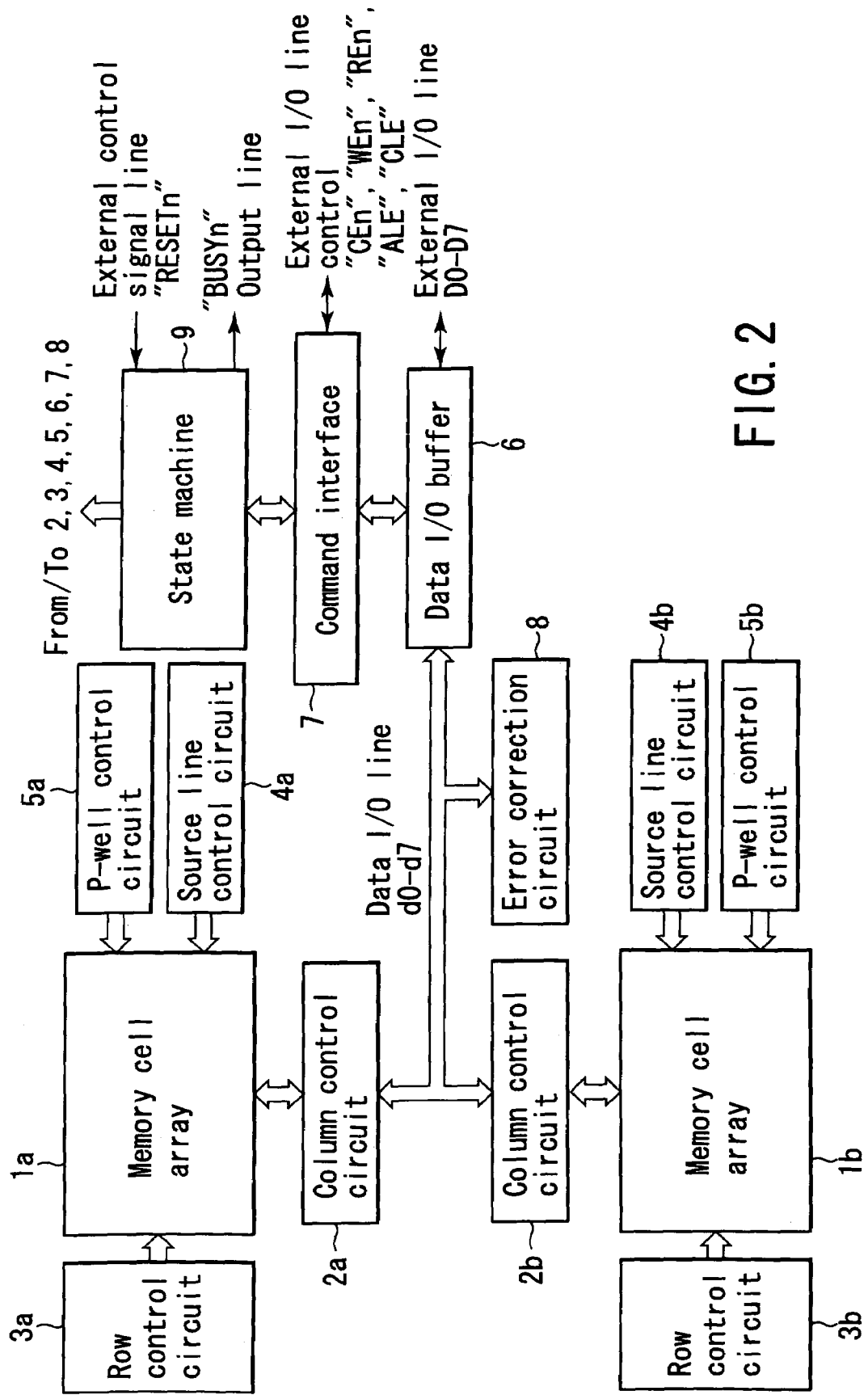
FIG. 2 is a block diagram showing the configuration of the NAND flash memory shown in FIG. 1.

FIG. 2 is a block diagram showing the configuration of the NAND flash memory 101 shown in FIG. 1.

The NAND flash memory 101 of the embodiment is provided with several (e.g., two) memory cell arrays 1a and 1b. The memory cell arrays 1a and 1b are provided with column control circuits 2a, 2b, row control circuits 3a, 3b, source line control circuit 4a, 4b, and p-well control circuits 5a, 5b, respectively.

The memory cell arrays 1a and 1b each has a plurality of flash memory cells arrayed in a matrix manner. The column control circuits 2a and 2b are arranged adjacent to individually corresponding memory cell arrays 1a and 1b. The column control circuits 2a and 2b control bit lines of memory cell arrays 1a and 1b, and make data erase, data write and data read with respect to the selected memory cells. The row control circuits 3a and 3b select word lines of individually corresponding memory cell arrays 1a and 1b, and applies voltages required for data erase, data write and data read. The source line control circuits 4a and 4b control source lines of individually corresponding memory cell arrays 1a and 1b. The p-well control circuits 5a and 5b control the potentials of p-wells formed in the semiconductor substrate with respect to individually corresponding memory cell arrays 1a and 1b.

A data I/O buffer 6 is connected to an external I/O line D0-D7 to receive write data, output read data and receive address data and command data. More specifically, the data I/O buffer 6 sends write data received from an external device to column control circuits 2a and 2b. Then, the data I/O buffer 6 receives data read from these column control circuits 2a and 2, and thereafter, outputs the read data to the external device. In addition, the data I/O buffer 6 sends address data received from the external device to select the memory cell to column control circuits 2a and 2b and row control circuits 3a and 3b via a state machine 9. In addition, the data I/O buffer 6 sends command data received from the external device to a command interface 7.

The command interface 7 receives control signals CEn, REn, ALE and CLE from the external device, and determines whether data inputted to the data I/O buffer 6 is write data, command data or address data. If the inputted data is command data, the command interface 7 transfers the command data to the state machine 9 as a receipt command signal.

An error correction circuit 8 generates check codes for error correction with respect to the write data received from the external device. In addition, the error correction circuit 8 detects an error from data read from memory cells of memory cell arrays 1a and 1b.

The state machine 9 controls the whole of the flash memory. Namely, the state machine receives commands from the external device, and controls read, write, erase and data input and output.

FIGS. 3A and 3B are diagrams showing the configuration of typical memory cell array 1a, for example, selected from two memory cell arrays 1a and 1b shown in FIG. 1.

The memory cell array 1a is divided into several blocks BLOCK0-BLOCK1023, as shown in FIG. 3A. Each block BLOCKi (i=0 to 1023) is erase minimum unit, and is composed of 4224 NAND type memory units, as seen in FIG. 3B.

In the embodiment shown in FIG. 3B, each NAND type memory unit comprises four memory cells M connected in series. One terminal of the memory unit is connected to a bit line BLj (j=0 to 4223) via a first select gate SG1; the other terminal thereof is connected to a common source line C-source via a second select gate transistor SG2.

The gate of the first select gate transistor SG1 is connected to a first select gate line SGD-i corresponding to the block BLOCKi (i=0 to 1023). The gate of the second select gate transistor SG2 is connected to a second select gate line SGS-i corresponding to the block BLOCKi. The gates of four memory cells M are connected individually to word lines WL0-i to WL3-i corresponding to the block BLOCKi. Data write and read are simultaneously carried out with respect to 4224 memory cells connected to one word line. One-bit data stored in each memory cell (4224 bits in total, 528-byte data using continuously adjacent 8 bits as one unit) forms write and read minimum unit (page).

FIG. 4 is a cross-sectional view showing the structure of typical one selected from memory cells M shown in FIG. 3B.

Double structure of n-well 12 and p-well 13 is formed on a p-type semiconductor substrate 11 n-type diffusion layers 14 formed on the p-well 13 function as source/drain regions. A tunnel oxide film 15 is formed on a channel region, and a floating gate 16 is stacked thereon. Further, ONO film (stacked film comprising Oxide film/Nitride film/Oxide film) 17 and control gate 18 are stacked in the order mentioned. The control gate 18 functions as part of the word line.

Figure 5:
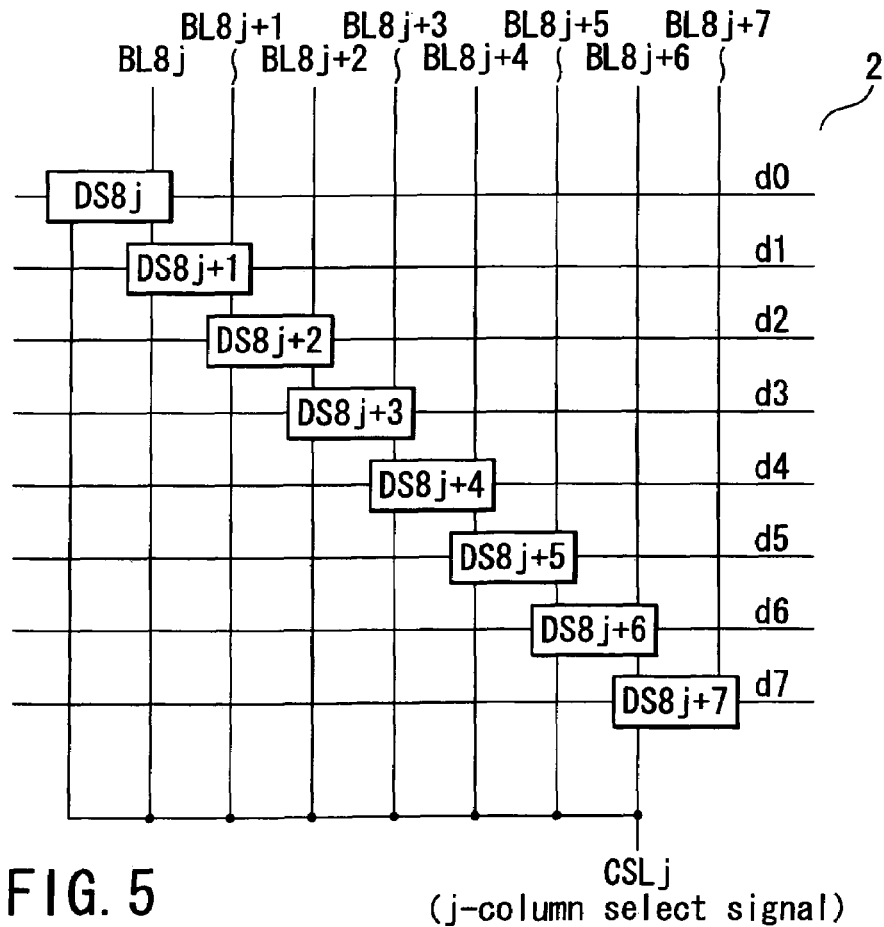
FIG. 5 is a circuit diagram showing the configuration corresponding to one-byte data of one selected from two column control circuits shown in FIG. 2.

FIG. 5 is a circuit diagram showing the configuration of a part (corresponding to one-byte data) of one of the two column control circuits 2a and 2b shown in FIG. 2.

Data storage circuits (DS) DS8j to DS8j+7 are connected to eight bit lines BL8j to BL8j+7, respectively. The data storage circuits DS8j to DS8j+7 are connected to the data I/O buffer 6 shown in FIG. 2 via data I/O lines d0 to d7, and stores write data or read data. The data storage circuits are selected by the same column select signal CSLj using eight data storage circuits DS8j to DS8j+7 as a unit, and data is inputted thereto or outputted therefrom.

In the write operation, the data storage circuits DS8j to DS8j+7 control voltages of bit lines BL8j to BL8j+7 according to stored write data, thereby carrying out write control. On the other hand, in the read operation, the data storage circuits DS8j to DS8j+7 sense voltages on the bit lines BL8j to BL8j+7 to store the data. In this case, the eight data storage circuits DS8j to DS8j+7 are each controlled according to the common control signal CSLj except for the data I/O operation during which these circuits simultaneously function.

Figure 6:
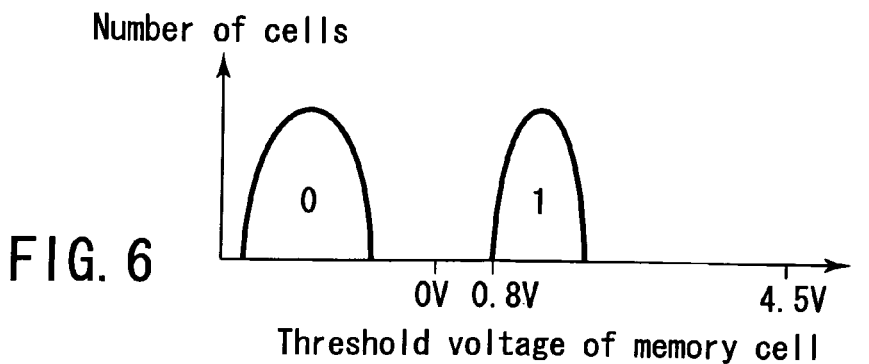
FIG. 6 is a view showing the relationship between data of the NAND flash memory shown in FIG. 1 and threshold voltage of the memory cell shown in FIG. 4 and its distribution.

FIG. 6 is a view showing the relationship between data or number of the NAND flash memory shown in FIG. 2 and threshold voltages of the memory cell M shown in FIG. 4 and its distribution.

Data erase is carried out by applying a high voltage (e.g., 20V) to the p-well 13 of FIG. 4 and setting the control gate 18 to 0V. In this case, electrons are ejected from the floating gate 16 to the p-well 13 via the tunnel oxide film 15, so that the threshold voltage of the memory cell M becomes 0V or less. This is "0" storage state.

Data write is carried out by setting the p-well 13 and the n-type diffusion layers 14 to 0V and setting the control gate 18 to a high voltage (e.g., 20V). By doing so, electrons are injected from the channel region to the floating gate 16, so that the threshold voltage of the memory cell M becomes positive. In this case, if the threshold voltage exceeds 0.8V, the write operation is inhibited every memory cell; therefore, the threshold voltage becomes 4.5V or less. This is "1" write state.

TABLE 1

|  | Erase | "1" write | "0" write | Read | Erase verify | Write verify |
|---|---|---|---|---|---|---|
| BL | Floating | 0 V | 3 V | H or L | H or L | H or L |
| SGD | Floating | 3 V | 3 V | 4.5 V | 4.5 V | 4.5 V |
| WL3 | 0 V | 10 V | 10 V | 4.5 V | 0 V | 4.5 V |
| WL2 | 0 V | 20 V | 20 V | 0 V | 0 V | 0.8 V |
| WL1 | 0 V | 10 V | 10 V | 4.5 V | 0 V | 4.5 V |
| WL0 | 0 V | 10 V | 10 V | 4.5 V | 0 V | 4.5 V |
| SGS | Floating | 0 V | 0 V | 4.5 V | 4.5 V | 4.5 V |
| C-source | Floating | 0 V | 0 V | 0 V | 0 V | 0 V |
| C-p-well | 20 V | 0 V | 0 V | 0 V | 0 V | 0 V |

The table 1 shows voltages of each element in erase, write, read, erase verify and write verify operations. Incidentally, in the write and read operations shown in the table 1, it is assumed that one word line (e.g., WL2) of four word lines WL0 to WL3 corresponding to four memory cells M is selected.

When the p-well 13 is set to 20V, and all word lines WL0 to WL3 of the selected block is set to 0V, electrons are ejected from the floating gate 16 of the memory cell M shown in FIG. 4. As a result, the threshold voltage becomes negative and "0" state is given. In this case, word lines and bit lines of the non-selected block are of the floating state, and become nearly 20V by the capacitive coupling with the p-well 13.

Write is carried out by applying the program voltage Vpgm of 14V to 20V to the selected word line WL2. In this case, when the selected bit line BLj is set to 0V, electrons are injected to the floating gate 16 of the selected memory cell M; therefore, the threshold voltage increases ("1" write). On the contrary, when the selected bit line BLj is set to the source voltage Vdd (3V), the increase of the threshold voltage of the selected memory cell M is inhibited ("0" write).

Read is carried out by applying a read voltage of 0V to the selected word line WL2. If the threshold voltage of the selected memory cell M is less than the read voltage, the selected bit line BLj is connected to the common source line C-source. Therefore, the potential of the bit line BLj becomes relatively low level L. On the contrary, if the threshold voltage of the selected memory cell M is more than the read voltage, the selected bit line BLj is not connected to the common source line C-source. Therefore, the potential of the bit line BLj becomes relatively high level H.

Erase verify is carried out by setting all word lines W10 to WL3 of the selected block to 0V. If the threshold voltages of four memory cells M in the NAND type memory unit are all less than 0V, the bit lines BLj are connected to the common source line C-source. Therefore, the potential of the bit lines BLj becomes relatively low level L. On the contrary, if the threshold voltage of any one of four memory cells M is more than 0V, the path between the bit line BLj and the common source line C-source are non-conductive. Therefore, the potential of the bit line BLj becomes at a relatively high level H.

Write verify is carried out by applying a verify voltage of 0.8V to the selected word line WL2. If the threshold voltage of the memory cell M is less than the verify voltage, the current path between the bit line BLi and the common source line C-source becomes conductive. Therefore, the potential of the bit line BLi becomes at a relatively low level L. On the contrary, if the threshold voltage of the memory cell M is more than the verify voltage, the current path between the bit line BLi and the common source line C-source are non-conductive. Therefore, the potential of the bit line BLi is held at a relatively high level H.

Figure 7:
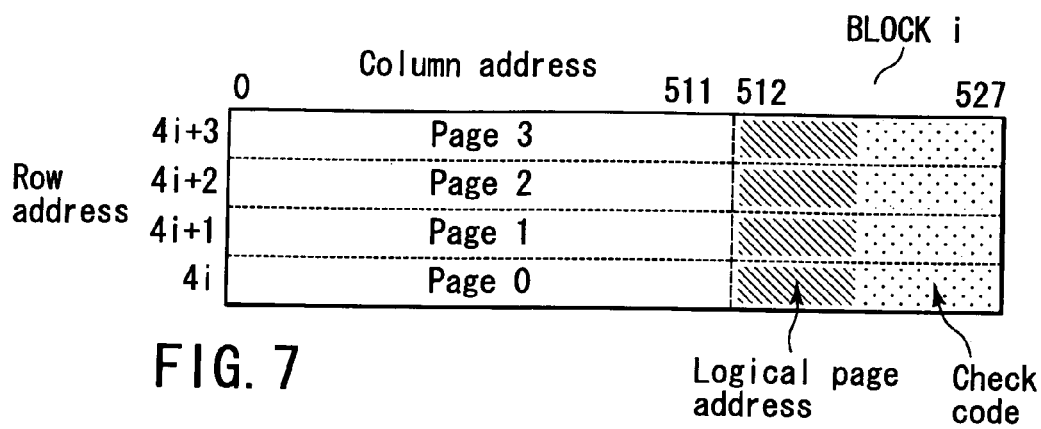
FIG. 7 is a view showing data format in a block, which is not formed in a ROM area of the memory cell array shown in FIG. 2.

FIG. 7 is a view showing a data format in a memory block BLOCKi provided outside of the ROM area in the memory cell arrays 1a and 1b shown in FIG. 2.

The memory cells in the block BLOCKi are designated by row addresses 4i, 4i+1, 4i+2, 4i+3 (i=0 to 1023: i denotes a block number), column addresses 0 to 527 and IO numbers 0 to 7, as shown in FIG. 7.

In this case, the row address 4i corresponds to the word line equivalent to the word line WL0_i of FIG. 3, that is, to the page Page0, which is a write/read unit. Likewise, the row address 4i+1 corresponds to the page Page1, the row address 4i+2 corresponds to the page Page2 and the row address 4i+3 corresponds to the page Page3.

File data is stored in memory cells corresponding to the addresses 0 to 511 of the column addresses 0 to 527 shown in FIG. 7 with a 512-byte data length N. The 512-byte data length N corresponds to the sector size of a magnetic disk so that it is convenient when the magnetic disk is replaced with the NAND flash memory. In general, the file data is used after being transferred to the SRAM 102 shown in FIG. 2. Thus, it is convenient to use the n-th power of 2 (n is positive integers) as the data length N.

Logical address data of the file data and an error check code are stored in memory cells corresponding to the addresses 512 to 527 in the column addresses 0 to 527 shown in FIG. 7 with 16-byte data length M (N>M). The error check code is concerned with the file data and the logical address data.

The error check code is generated in the MPU 103 of FIG. 1 with respect to the file data and the logical address data, and thereafter, written to the NAND flash memory 101. If an error exists in the file data and the logical address data read from the NAND flash memory 101, the MPU 103 makes corrections using the corresponding error check code.

Figure 8A:
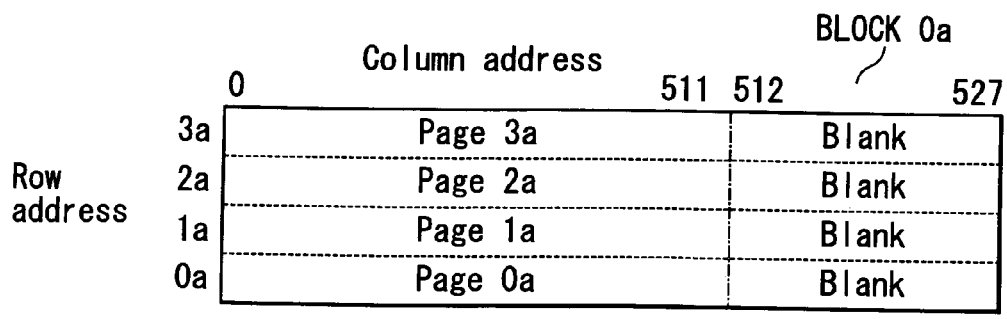
FIGS. 8A and 8B are views showing data format using two ROM area blocks of the memory cell array shown in FIG. 2.
Figure 8B:
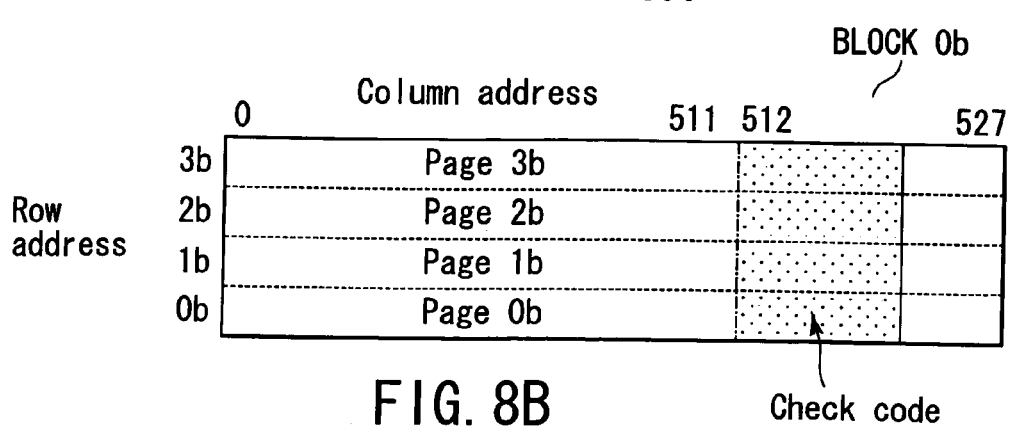

FIG. 8A shows a data format using a block BLOCK0a of an ROM area in the memory cell array 1a shown in FIG. 2, and FIG. 8B shows a data format using a block BLOCK0b of another ROM area in the memory cell array 1b.

In this embodiment, the two blocks BLOCK0a and BLOCK0b are used not to store file data such as those stored in a magnetic disk, but to store system boot programs of various electronic apparatuses. For this reason, sufficient amount of data necessary for starting the system should be stored more than that of 528-byte unit data length.

According to the embodiment, data longer than the 512-byte data length N is stored as a series of data using two blocks BLOCK0a and BLOCK0b. For example, two blocks BLOCK0a and BLOCK0b of memory cell arrays 1a and 1b are used, thereby storing 1 K (512+512=1024)-byte data including two pages Page0a and Page0b as a series data. The 1 K-byte data is replaced with the data of the conventional ROM 104 shown in FIG. 20; therefore, it is convenient to use the k-th power of 2 (k is positive integers, K>N) as the data length K.

The error check code generated by the error correction circuit 8 of FIG. 2 is stored in 16-byte area of the column addresses 512 to 527 of the second page Page0b with respect to the 1 K-byte data.

In the embodiment, blocks BLOCK0a and BLOCK0b of ROM areas of the two memory cell arrays 1a and 1b are used in a state of being combined. By doing so, access is simultaneously made with respect to the blocks BLOCK0a and BLOCK0b of the two ROM areas. Therefore, access can be simply made in the embodiment.

On the contrary, if two ROM areas are provided in one memory cell array, and if serial data of a data length K+16-byte is stored in two ROM areas, access is not simultaneously made with respect to the two ROM areas. For this reason, access becomes complicate unlike the present embodiment.

As seen from FIG. 2 to FIG. 8, the NAND flash memory of the embodiment has the following constitutive features. The NAND flash memory comprises electrically rewritable non-volatile semiconductor memory cells, an interface (6, 7, 9), an error correction circuit 8, and a control circuit (2a to 5a and 2b to 5b). More specifically, the interface (6, 7, 9) makes data exchange with an external device to carry out data write/read with respect to the non-volatile semiconductor memory cells, and decodes commands. The error correction circuit 8 makes error corrections with respect to write data/read data of the non-volatile semiconductor memory cells. The control circuit controls these non-volatile semiconductor memory cells.

In this case, several (two in the embodiment) memory cell arrays 1a and 1b formed of a plurality of electrically rewritable non-volatile semiconductor memory cells individually have a ROM area. Error correction is possible with respect to the data of the ROM area in the flash memory, so that high reliability of the electronic apparatus can be obtained. Thus, it is possible to store programs in an ROM area of a flash memory for system boot of an electronic apparatus provided with the flash memory.

Consequently, in the NAND flash memory of the embodiment, the flash memory itself has the function equivalent to an ROM for booting the system using the same.

In addition, the NAND flash memory has the following functions (details thereof will be described later with reference to FIG. 9A to FIG. 14H).

(1) The interface and the control circuit have the following first and second read modes.

According to the first read mode, the read operation is carried out via a first bootstrap, and (N+M)-byte (N is the n-th power of 2, n is positive integers, N>M) data is continuously outputted via the interface. According to the second read mode, the read operation is carried out via a second bootstrap, and K-byte (K is the k-th power of 2, k is positive integers, N>M) data is continuously outputted via the interface.

(2) The interface, the error correction circuit and the control circuit have the following first and second read modes.

According to the first read mode, the read operation is carried out via a first bootstrap, and (N+M)-byte (N is the n-th power of 2, n is positive integers, N>M) data is continuously outputted via the interface. According to the second read mode, the read operation is carried out via a second bootstrap, and K-byte (K is the k-th power of 2, k is positive integers) data is continuously outputted via the interface after error corrections are made.

(3) The interface, error correction circuit and control circuit have the following first and second write modes.

According to the first write mode, (N+M)-byte (N is the n-th power of 2, n is positive integers, N>M) data inputted by the interface via a first bootstrap is fetched. Thereafter, the (N+M)-byte data is collectively written to the memory cells.

According to the second write mode, K-byte (K is the k-th power of 2, k is positive integers) data inputted by the interface via a second bootstrap is fetched. Thereafter, an error check code for error correction is automatically generated with respect to the K-byte data, and the K-byte data and the error check code are collectively written to the memory cells. The function described in the item (3) may be combined with the function described in the item (2).

Figure 18:
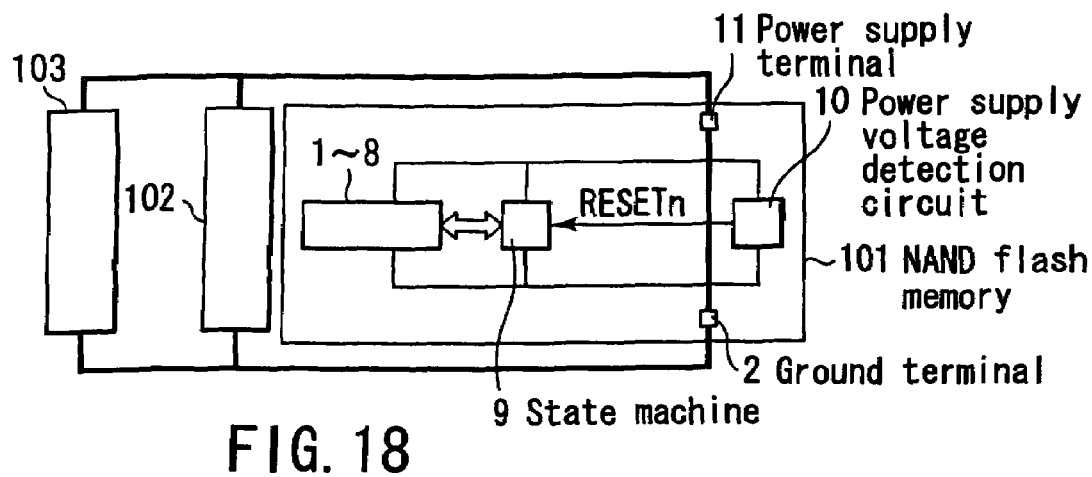
FIG. 18 is a block diagram showing the configuration of the control system when the NAND flash memory shown in FIG. 1 is provided with a source voltage detection circuit.
Figure 19:
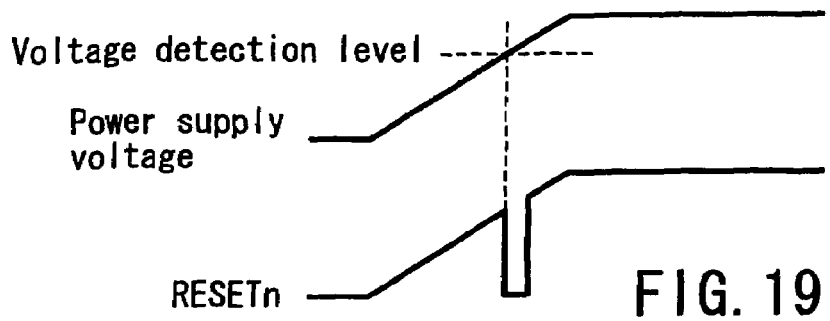
FIG. 19 is a waveform chart showing a reset signal RESETn shown in FIG. 18.

(4) The power supply voltage detection circuit, an interface and a control circuit have the following first and second read modes when a power supply voltage detection circuit is provided as described later by referring to FIG. 18.

According to the first read mode, data is read from the non-volatile semiconductor memory cells via a first bootstrap booted by a signal inputted to the interface. Thereafter, the data at the maximum of (N+M)-byte (N is the n-th power of 2, n is positive integers, N>M) is continuously outputted via the interface. According to the second read mode, data is read from the non-volatile semiconductor memory cells via a second bootstrap booted by a boot signal outputted from the power supply voltage detection circuit. Thereafter, the data at the maximum of K-byte (K is the k-th power of 2, k is positive integers) is continuously outputted via the interface.

(5) The power supply voltage detection circuit, the error correction circuit, the interface and the control circuit have the following first and second read modes when a power supply voltage detection circuit is provided as described later by referring to FIG. 18.

According to the first read mode, these circuits described above are booted by a signal inputted to the interface to read data from the non-volatile semiconductor memory cells. According to the second read mode, these circuits are booted by a boot signal outputted from the power supply voltage detection circuit to read data from the non-volatile semiconductor memory cells. In addition, the error correction circuit makes corrections on the data read in the second read mode.

(6) The interface and the control circuit have the following first and second read modes.

According to the first read mode, data is read from the non-volatile semiconductor memory cells via a first bootstrap. According to the second read mode, data is read from the non-volatile semiconductor memory cells via a second bootstrap. During the second read mode, part of the signals inputted to the interface is invalidated.

The above-mentioned functions of the NAND flash memory will be described below in detail with reference to FIG. 9A to FIG. 14H, FIG. 18 and FIG. 19.

FIGS. 9A to 9H are timing waveform charts to explain the operation of reading data except for the ROM area of the NAND flash memory shown in FIG. 2 in the same read mode as the conventional NAND flash memory.

When a reset signal RESETn is "H" and a command latch enable signal CLE is "H", a write enable signal WEn becomes "L", and thereby, data 00h inputted to the data I/O buffer 6 is fetched as a read command.

When an address latch enable signal ALE is "H", data inputted to the data I/O buffer 6 is fetched as address data Add0 to Add3 every when the signal WEn becomes "L".

According to addresses thus fetched, a page is selected, and data is read from the memory cell arrays 1a or 1b to column control circuit 2a or 2b. In this case, "L" is outputted as a busy signal Busy. If data output to an external device is possible from the column control circuit 2a or 2b via the data I/O buffer 6, the busy signal Busy is returned to "H". Thereafter, data is outputted in synchronous with a read enable signal REn, and when the last data (528-th byte data) of the selected page is outputted, output standby state is automatically given.

Incidentally, those data denoted by the hatched portions in FIG. 9F show that the denoted data may be undefined.

FIGS. 10A to 10H are timing waveform charts to explain the operation of reading data except for the ROM area of the NAND memory shown in FIG. 2 in a read mode different from the read mode shown in FIGS. 9A to 9H.

Here, command standby state coincides with read standby state. In other words, when the reset signal RESETn is "H" and the signal ALE is "H", data inputted to the data I/O buffer 6 is fetched as address data Add0 to Add3 every when the signal WEn becomes "L".

According to addresses thus obtained, a page is selected, and data is read from the memory cell arrays 1a or 1b to the column control circuit 2a or 2b. In this case, "L" is outputted as a busy signal Busy. If data output to an external device is possible from column control circuit 2a or 2b via the data I/O buffer 6, the busy signal Busy is returned to "H". Thereafter, data is outputted in synchronous with a read enable signal REn, and when the last data (528-th byte data) of the selected page is outputted, the next page is automatically selected. Thus, busy state, that is, output standby state is given. Incidentally, hatched portions in FIG. 10F are those data which may be undefined.

FIGS. 11A to 11H are timing waveform charts to explain the operation of carrying out system boot (boot operation) in a command-less address mode by hardware reset of the NAND flash memory according to data of the ROM area of the NAND memory shown in FIG. 2.

Hardware reset is booted when the reset signal RESETn supplied from the system controller becomes "H". In this case, signals ALE and CLE are invalidated, and pages Page0a and Page0b are selected so that data can be read from the memory cell array 1a or 1b to the column control circuit 2a or 2b. In addition, "L" is outputted as the busy signal Busy. If data output to an external device is possible from the column control circuit 2a or 2b via the data I/O buffer 6, the busy signal Busy is restored to "H".

Thereafter, data is outputted in synchronous with the read enable signal REn, and when the last data (1024-th byte data) of the selected page is outputted, the next page is automatically selected. Thus, busy state, that is, output standby state is given. When data output of the last pages Page3a and Page3b is completed, the NAND flash memory is changed to a normal operation mode. Incidentally, the NAND flash memory is changed to a normal operation mode even if the signal WEn is set to "L" on the way of outputting the last page data.

The error correction circuit 8 detects an error position from data read to the column control circuit 2a or 2b while "L" is outputting as the busy signal Busy. By doing so, data having an error is outputted after being inverted in the output operation. Incidentally, data denoted by the hatched portions in FIGS. 11A to 11H are data which may be undefined. In FIGS. 11A to 11H, tRCV denotes a recovery period, and the recovery operation is carried out from the fall of the signal WEn until boot mode is completed.

During the boot operation period, one or more signals (signals ALE, CLE in the embodiment) of whole signals inputted to the interface is invalidated.

The reset signal RESETn may be automatically generated by an internal circuit of the electronic apparatus. For example, as shown in FIG. 18, the NAND flash memory 101 is provided with a power supply voltage detection circuit 10. The power supply voltage detection circuit 10 detects a rise of power supply made via a power supply terminal 11 of the NAND flash memory 101. As seen from FIG. 19, a reset signal RESETn is generated after a rise of the power supply is detected. The power voltage supplied across the power supply terminal 11 and a ground terminal 12 is applied in common to SRAM 102 and MPU 103.

FIGS. 12A to 12H are timing waveform charts to explain the operation of carrying out system boot (boot operation) according to a command from MPU 103 by software reset of the NAND flash memory according to the data of the ROM area of the NAND memory shown in FIG. 2.

When the reset signal RESETn is "H" and the CLE signal is "H", the signal WEn becomes "L", and thereby, data Afh inputted to the data I/O buffer 6 is fetched as ROM area read command.

Signals ALE and CLE are invalidated, and pages Page0a and Page0b are selected so that data can be read from memory cell array 1a or 1b to column control circuit 2a or 2b. In this case, "L" is outputted as the busy signal Busy. If data output to an external device is possible from column control circuit 2a or 2b via the data I/O buffer 6, the busy signal Busy is restored to "H".

Thereafter, data is outputted in synchronous with the read enable signal REn, and when the last data (1024-th byte data) of the selected page is outputted, the next page is automatically selected. Thus, busy state, that is, output standby state is given. When data output of the last pages Page3a and Page3b is completed, the NAND flash memory is changed to a normal operation mode. Incidentally, the NAND flash memory is changed to a normal operation mode even if the signal WEn is set to "L" on the way of outputting the last page data.

The error correction circuit 8 detects an error position from data read to column control circuit 2a or 2b while "L" is outputting as the busy signal Busy. By doing so, data having an error is outputted after being inverted in the output operation. Incidentally, the hatched portions in FIGS. 12A to 12H show that the corresponding data may be undefined.

FIGS. 13A to 13H are timing waveform charts to explain the operation of writing data to areas other than ROM area of the NAND memory shown in FIG. 2 in the same write mode as the NAND flash memory.

When the reset signal RESETn is "H" and the signal CLE is "H", the signal WEn becomes "L", and thereby, data 80h inputted to the data I/O buffer 6 is fetched as a data input command. When the signal ALE is "H", data inputted to the data I/O buffer 6 is fetched as address data Add0 to Add3 every when the signal WEn becomes "L". Thereafter, when the signal ALE is "L", data inputted to the data I/O buffer 6 is fetched as a write cache data up to the maximum 528 bytes every when the signal WEn becomes "L".

When the signal CLE again becomes "H", the signal WEn becomes "L", and thereby, data 10h inputted to the data I/O buffer 6 is fetched as a data write command. Then, "L" is outputted as the busy signal Busy, and as described above, according to address data thus fetched, a page is selected. Write data stored in column control circuit 2a or 2b is written to memory cell array 1a or 1b. After the write operation is completed, the busy signal Busy is returned to "H". Incidentally, hatched portions in FIGS. 13A to 13H show that data may be undefined.

FIGS. 14A to 14H are timing waveform charts to explain the operation of writing data to the ROM area of the NAND memory shown in FIG. 2.

When the reset signal RESETn is "H", the signal CLE is "H" and the signal CLE is "H", the signal WEn becomes "L", and thereby, data 40h inputted to the data I/O buffer 6 is fetched as a ROM area designation command. Thereafter, when the signal CLE is "H", the signal WEn becomes "L", and thereby, data 80h inputted to the data I/O buffer 6 is fetched as a data input command. When the signal ALE is "H", data inputted to the data I/O buffer 6 is fetched as address data Add0 to Add3 every when the signal WEn becomes "L". Thereafter, when the signal ALE is "L", data inputted to the data I/O buffer 6 is fetched as a write data cache up to the maximum 1024 bytes every when the signal WEn becomes "L".

When the signal CLE again becomes "H", the signal WEn becomes "L", and thereby, data 10h inputted to the data I/O buffer 6 is fetched as a data write command. Then, "L" is outputted as the busy signal Busy, and as described above, according to address data thus fetched, a page is selected. Write data stored in column control circuit 2a or 2b is written to memory cell arrays 1a or 1b. Before the write operation is carried out, the error check code generated by the error correction circuit 8 is stored in column control circuit 2a or 2b, and the write data and the error check code are written. After the write operation is completed, the busy signal Busy is restored to "H". Incidentally, the hatched portions in FIG. 14F show that data may be undefined.

SECOND EMBODIMENT

Figure 15:
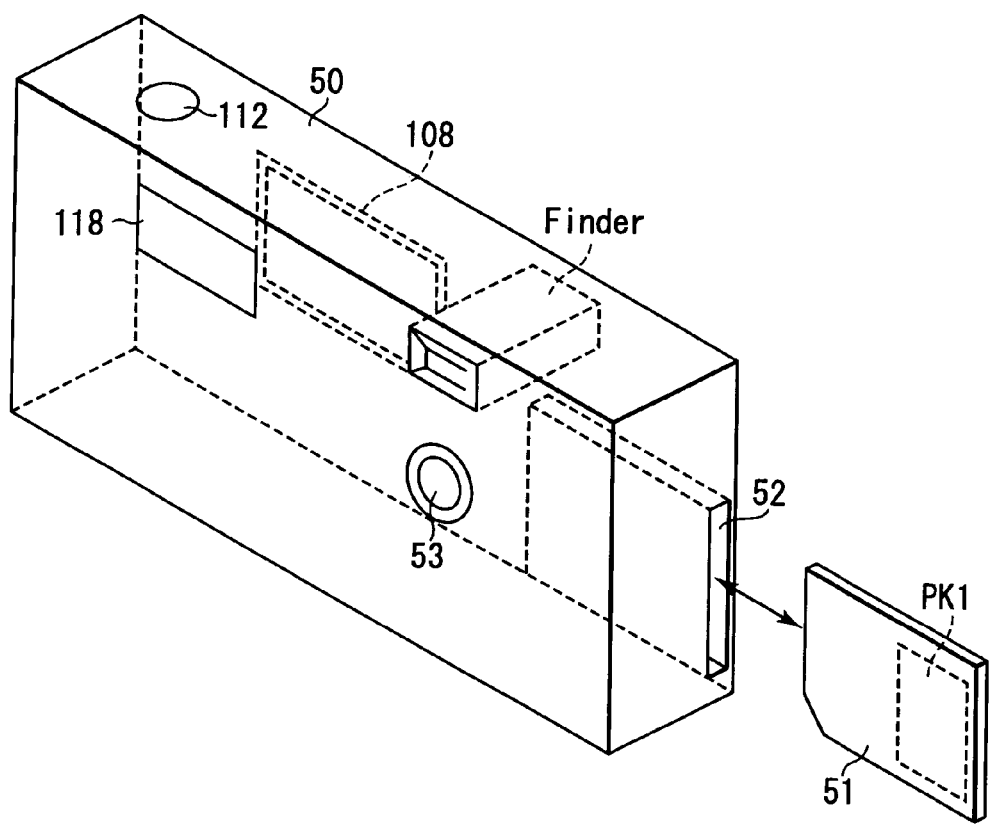
FIG. 15 is a partially perspective view showing an electronic card using the NAND flash memory according to the first embodiment, and showing a digital still camera given as one example of an electronic apparatus using the electronic card.

FIG. 15 shows an electronic card using the NAND flash memory of the above-mentioned embodiment and an electronic apparatus using the electronic card.

Here, there is shown a portable (mobile) electronic apparatus, that is, a digital still camera 50 given as one example of the electronic apparatus. An electronic card (e.g., memory card) 51 used as recoding medium of the digital still camera 50 has a built-in IC package PK1, which is integrated and sealed with the NAND flash memory described in the first embodiment.

The case of the digital still camera 50 is provided with a card slot 52 and a circuit board (not shown) connected thereto. The memory card 51 is electrically connected to electronic circuits on the circuit board in a state of being removably loaded in the card slot 52. If the memory card 51 is a non-contact type IC card, the memory card 51 may be inserted into the card slot 52, or put near the outside of the card slot 52. By doing so, the memory card 51 may be electrically connected to the circuit board by a wireless manner.

In FIG. 15, a reference numeral 53 denotes a lens, 108 denotes a display (e.g., liquid-crystal monitor), 112 denotes an operation button (e.g., shutter button) and 118 denotes a flash lamp.

Figure 16:
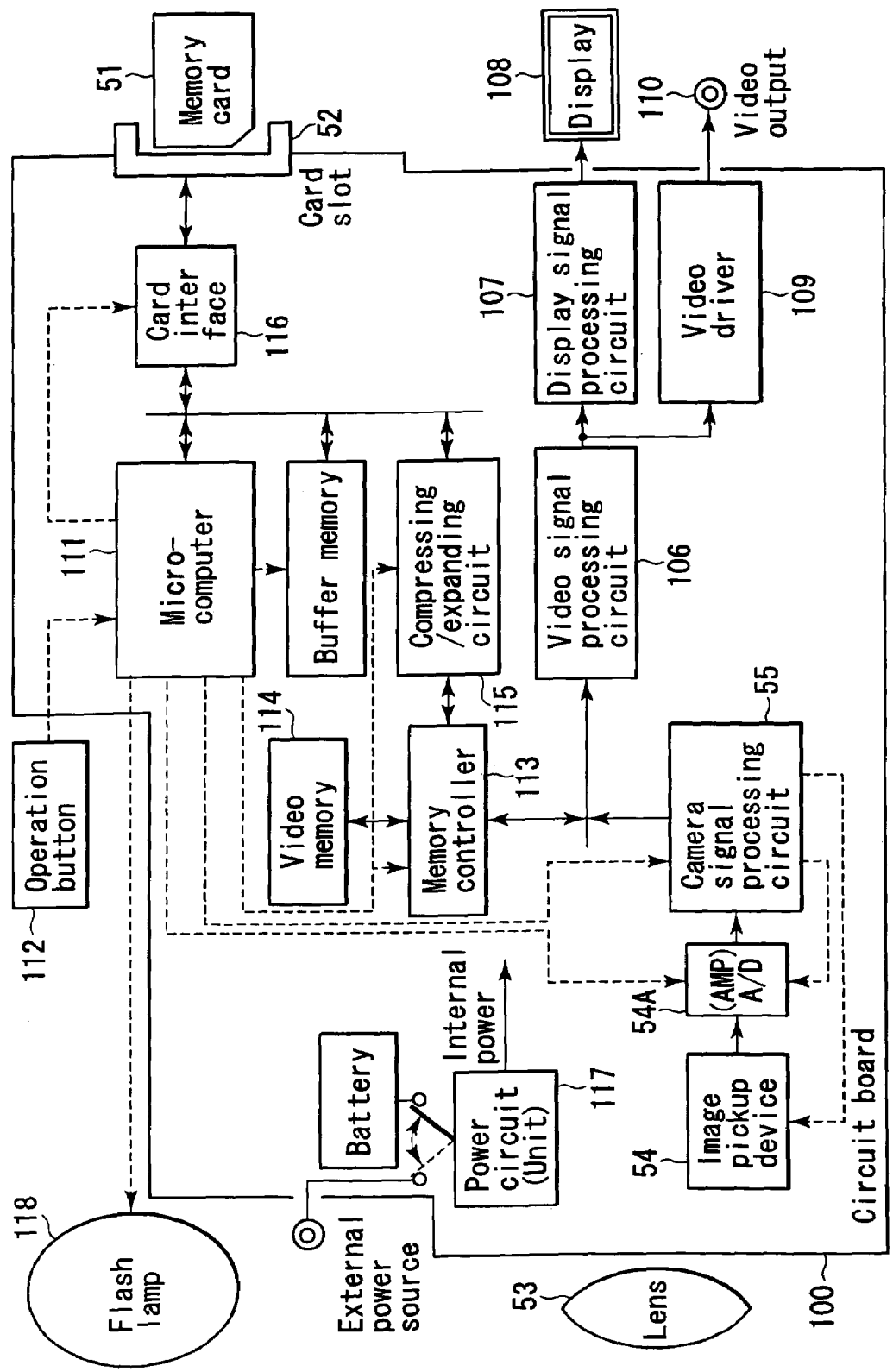
FIG. 16 is a block diagram showing the basic configuration of the digital still camera shown in FIG. 15.

FIG. 16 is a block diagram showing the basic configuration of the digital still camera shown in FIG. 15.

Light from a subject to be photographed is collected by the lens 53, and inputted to an image pickup device 54. The image pickup device (e.g., CMOS image sensor) 54 photoelectrically converts the inputted light, and thereafter, outputs an analog signal. The analog signal is amplified by an analog amplifier (AMP) included in an analog/digital (A/D) converter 54A, and thereafter, converted into a digital signal by the A/D converter 54A. The converted signal is inputted to a camera signal processing circuit 55. The signal is converted into luminance signal and color difference signal after automatic exposure control, automatic white balance control and color separation processing are carried out.

When monitoring an image of the object, the signal outputted from the camera signal processing circuit 55 is inputted to a video signal processing circuit 106 so that it can be converted into a video signal. For example, NTSC (National Television System Committee) is given as the video signal system. A microcomputer 111 controls the image pickup device 54, the A/D converter 54A and camera signal processing circuit 55.

The video signal is outputted to a display 108 mounted to the housing of the digital still camera 50, which is connected with a display signal processing circuit 107. In addition, the video signal is supplied to a video output terminal 110 via video driver 109.

The image picked-up by the digital still camera 50 is outputted as video output to an image display device such as a television set via the video output terminal 110. By doing so, devices other than the display 108 can display the picked-up image of the object.

In order to capture an image, a user pushes the operation button 112. By doing so, the microcomputer 111 controls a memory controller 113 so that the signal outputted from the camera signal processing circuit 55 can be written to a video memory 114 as a frame image. A compressing/expanding circuit 115 compresses the frame image thus written based on a predetermined compression format. Thereafter, the frame image thus compressed is recorded to the memory card 51 loaded in the card slot 52 via a card interface 116.

In order to reproduce the recorded image data, the image data recorded to the memory card 51 is read via the card interface 116, and expanded by the compressing/expanding circuit 115, and thereafter, written to the video memory 114. The image data thus written is inputted to the video signal processing circuit 106, and the image is displayed on the display 108 or image device like the case of monitoring the image.

According to the configuration, the following components are mounted on the circuit board 100. The components are card slot 52, image pickup device 54, A/D converter 54A, camera signal processing circuit 55, video signal processing circuit 106 and display 107. Further, the components are video driver 109, microcomputer 111, memory controller 113, video memory 114, compressing/expanding circuit 115 and card interface 116. In this case, the card slot 52 does not need to be mounted on the circuit board 100, and may be connected to the circuit board 100 via a connector cable (not shown).

A power circuit 117 is further mounted on the circuit board 100. The power circuit 117 (e.g., DC/DC converter) receives the supply of DC power from external power source or battery, and generates internal power supply voltage used in the digital still camera 50. The internal power supply voltage is supplied to flash lamp 118 and display 108 in addition to the above-mentioned circuits.

Figure 17A:
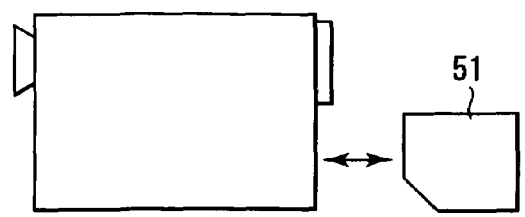
FIGS. 17A to 17J are front views showing various electronic apparatuses using the electronic card shown in FIG. 15.
Figure 17F:
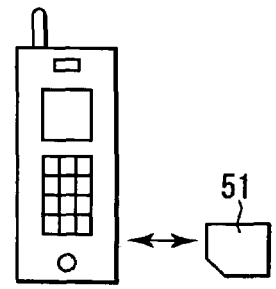
Figure 17B:
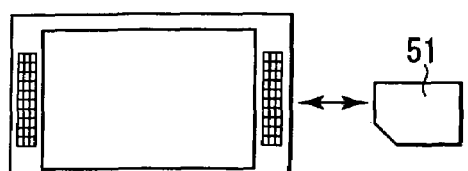
Figure 17G:
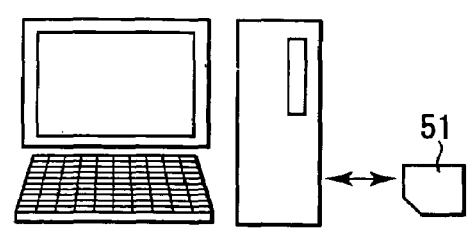
Figure 17C:
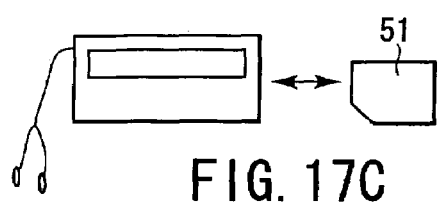
Figure 17H:
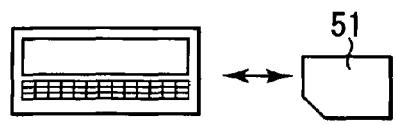
Figure 17D:
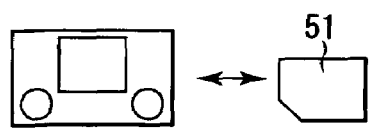
Figure 17I:
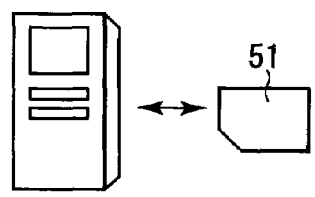
Figure 17E:
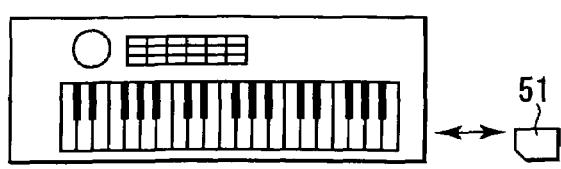
Figure 17J:
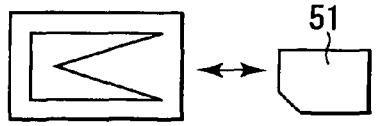

The electronic card 51 of the embodiment is applicable to various apparatuses briefly shown in FIG. 17A to FIG. 17J, in addition to portable electronic device such as the digital still camera. More specifically, FIG. 17A to FIG. 17J show video camera, television, audio device, game device, electronic music instrument, mobile phone, personal computer, personal digital assistant (PDA), voice recorder and PC card, respectively. The PC card shown in FIG. 17J is conformable to the PCMCIA standards such as a PC card memory.

The non-volatile semiconductor memory device of the present invention is not limited to the NAND type flash memory, and may be applied to NOR type flash memory.

Accordingly, one aspect of the present invention can provide a non-volatile semiconductor memory device, which has a ROM area capable of storing boot data of the system provided with the memory device, reduces the number of constituent devices of the system, and realizes the system at low cost. In addition, another aspect of the present invention can provide an electronic card using the non-volatile semiconductor memory device and an electronic apparatus using the electronic card.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A non-volatile semiconductor memory device comprising:
 a plurality of non-volatile semiconductor memory cells;
 an interface; and
 a control circuit for controlling the non-volatile semiconductor memory cells,
 wherein the device supports a first output mode for continuously outputting (N+M)-byte (N is the n-th power of 2, n is a positive integer) data via the interface, and a second output mode for continuously outputting K-byte (K is the k-th power of 2, k is a positive integer) data via the interface, and
 wherein the first output mode is substantially transferred to output standby state after continuously outputting the data, and the second output mode is automatically transferred to a normal operation mode after continuously outputting the data.

2. The device according to claim 1, wherein, in the first output mode, (N+M)-byte (N is the n-th power of 2, n is a positive integer, N>M) data is outputted.

3. The device according to claim 1, wherein the plurality of non-volatile semiconductor memory cells include a ROM area configured to store system boot programs and an area except for the ROM area, and in the second read mode, K(K>N) byte data is read from the ROM area.

4. The device according to claim 1, wherein the second output mode is booted according to a hardware reset signal supplied from an external device.

5. The device according to claim 1, wherein the second output mode is booted based on a software reset command supplied from an external device.

6. The device according to claim 1, wherein during the second output mode, part of the data inputted to the interface is invalidated.

* * * * *